United States Patent
Gawer et al.

(10) Patent No.: US 8,136,549 B2
(45) Date of Patent: Mar. 20, 2012

(54) SLUICE SYSTEM FOR A VACUUM FACILITY

(75) Inventors: Olaf Gawer, Dresden (DE); Jens Melcher, Dresden (DE); Dietmar Schulze, Dresden (DE); Hans-Christian Hecht, Weinbohla (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 0 days.

(21) Appl. No.: 12/753,175

(22) Filed: Apr. 2, 2010

(65) Prior Publication Data

US 2010/0206407 A1 Aug. 19, 2010

Related U.S. Application Data

(63) Continuation of application No. 10/574,368, filed as application No. PCT/DE2004/002265 on Oct. 12, 2004, now abandoned.

(30) Foreign Application Priority Data

Oct. 15, 2003 (DE) ................................. 103 48 639

(51) Int. Cl.
*E03B 5/00* (2006.01)
(52) U.S. Cl. .................... 137/565.29; 417/62; 417/205; 414/221
(58) Field of Classification Search ............ 137/565.29, 137/565.23, 565.3, 565.33; 417/62, 205; 414/221; 118/715
See application file for complete search history.

(56) References Cited

U.S. PATENT DOCUMENTS

| | | | |
|---|---|---|---|
| 2,931,561 A | 4/1960 | Hiesinger | |
| 4,956,196 A | 9/1990 | Wagner et al. | |
| 5,228,838 A | 7/1993 | Gebele | |
| 5,254,169 A | 10/1993 | Wenk | |
| 5,259,735 A | 11/1993 | Takahashi et al. | |
| 5,538,610 A | 7/1996 | Gesche et al. | |
| 5,703,281 A | 12/1997 | Myneni | |
| 5,782,402 A * | 7/1998 | Wieres ........................ 228/221 |
| 5,827,409 A | 10/1998 | Iwata et al. | |
| 6,503,379 B1 | 1/2003 | Kidd | |
| 2007/0209973 A1 * | 9/2007 | Gawer et al. ...................... 209/2 |

FOREIGN PATENT DOCUMENTS

| | | |
|---|---|---|
| DE | 3731686 | 4/1989 |
| DE | 4428136 | 2/1996 |

(Continued)

OTHER PUBLICATIONS

Patent Abstracts of Japan, vol. 014, No. 045, Jan. 26, 1990.
International Search Report for PCT/DE2004/002265, mailed Mar. 3, 2005.

(Continued)

*Primary Examiner* — Craig Schneider
*Assistant Examiner* — Andrew J Rost
(74) *Attorney, Agent, or Firm* — Heslin Rothenberg Farley & Mesiti P.C.

(57) ABSTRACT

A sluice system for a vacuum coating facility for coating substrates that can be moved through the vacuum coating in a direction of conveyance comprises a prevacuum slice chamber and a transfer chamber adjoining a coating chamber, wherein a fine vacuum can be regulated before the transfer chamber on the input side in the direction of conveyance and after the transfer device on the output side in the direction of conveyance. The prevacuum sluice chamber is directly adjacent to the transfer chamber and the fine vacuum can be regulated in the prevacuum sluice chamber. A high-vacuum pump system can also alternatively and selectively be connected to the prevacuum sluice chamber.

3 Claims, 3 Drawing Sheets

FOREIGN PATENT DOCUMENTS

Figure 1:
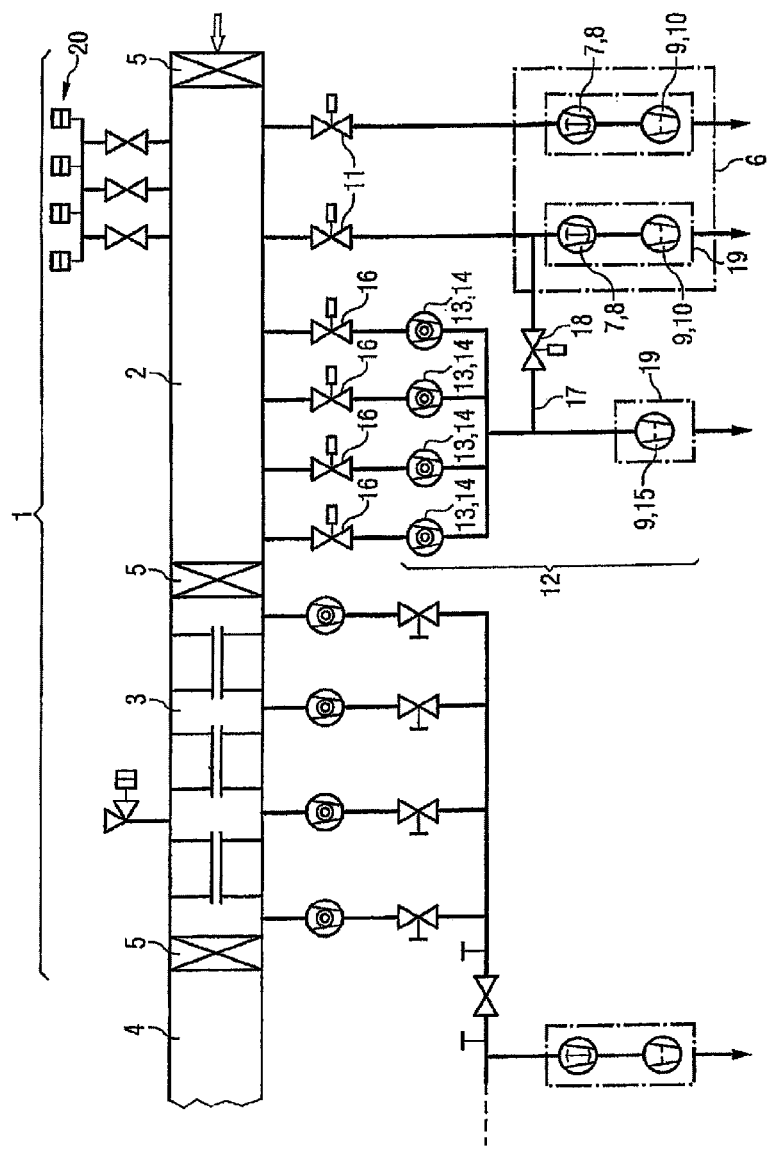

| | | |
|---|---|---|
| JP | 59061831 U | 4/1984 |
| JP | 01276554 | 7/1989 |
| JP | 01240644 A | 9/1989 |
| JP | 04326943 A | 11/1992 |
| JP | 06033231 A | 2/1994 |
| JP | 06239700 A | 8/1994 |

* cited by examiner

SLUICE SYSTEM FOR A VACUUM FACILITY

CROSS-REFERENCE TO RELATED APPLICATIONS

This application is a continuation of U.S. application Ser. No. 10/574,368, filed Mar. 31, 2006 now abandoned which is a 35 USC Section 371 filing of International application PCT/DE2004/002265 filed on Oct. 12, 2004 and published in German as WO 2005/040452 on May 6, 2005, and claims priority from German patent application number 103 48 639.9 filed on Oct. 15, 2003, the full contents of these applications being hereby incorporated herein by reference.

BACKGROUND ART

The invention relates to a sluice system for a vacuum coating facility for coating substrates that can be moved through the vacuum coating facility in a direction of conveyance. On the input and output sides, the sluice system comprises a prevacuum sluice chamber and a transfer chamber adjoining a coating chamber, wherein a fine vacuum can be regulated before the transfer chamber on the input side in the direction of conveyance and after the transfer device on the output side in the direction of conveyance.

Sluice systems for vacuum coating facilities of this type are primarily used in industrial applications in in-line large-area coating facilities typically for flat glass substrates. The usual structure of the sluice system incorporated on both sides of the coating chamber is shown in a diagram of a through-feed sluice system for coating architectural glass in "Vakummtechnik -Grundlagen and Anwendungen", Pupp/Hartmann, Carl Hanser Verlag, page 426. The sluice system normally consists of a prevacuum sluice chamber, a fine vacuum sluice chamber and a transfer chamber. If necessary, further fine vacuum sluice chambers with process-preparing and pressure-stabilizing functions are arranged in-line between the prevacuum sluice chamber and the transfer chamber. A prevacuum pressure of approx. $10^{-3}$ bar is generated in the prevacuum sluice chamber on the input side, in which the substrates are fed to the vacuum coating facility, and analogously in the prevacuum sluice chamber on the output side. This normally occurs via a prevacuum pump system connected to the prevacuum sluice chamber, consisting of a Roots pump, to which a rotary slide-valve pump is connected upstream as a backing pump.

The fine vacuum sluice chamber serves as a further pressure stage and pressure buffer for pressure stabilization. An intermediate vacuum with a pressure which is between the prevacuum pressure and the high-vacuum pressure, but close to that of the process vacuum pressure of the coating chambers, of approximately $10^{-3}$ bar is generated here. Normally, one or more pump systems with a power corresponding to the construction of the prevacuum pump system are connected to the fine vacuum sluice chamber. The substrates are prepared for transfer to the first coating chamber or guided out of the last coating chamber in the transfer chamber which adjoins the first and last coating chamber in the direction of conveyance respectively. A fine pressure vacuum is maintained there, which has attained the actual process vacuum pressure of approx. $10^{-4}$ bar to $10^{-5}$ bar. For this, several turbo-molecular pumps connected in parallel are normally connected to the transfer chamber to which a backing pump or a Roots pump combined with a backing pump are connected upstream. All sluice chambers of the sluice system are separated through vacuum technology among each other as well as on the atmosphere side and process side.

Increasingly high requirements are placed on the sluice system in respect to the cycles to be reduced for the total sluice time, as endeavors are increasingly being made to shorten the cycle times of vacuum coating facilities. The cycle times are determined by evacuation times, coating times and nonproductive times, that is times for transport of the substrate through the sluice chamber and the sluice valve opening and closing times. The non-productive times take up a considerable part of this and restrict a reduction of the cycle times as the evacuation times and coating times cannot be reduced further owing to physical constraints.

A reduction of the sluice cycle times typically results from the arrangement of a prevacuum sluice chamber and a transfer chamber with several pressure stages, as known from DE 198 08 163 C1. The chamber volume of the transfer chamber is divided into several buffer sections via special flow elements, with the result that a pressure decoupling of the process area from the prevacuum sluice chamber is enabled. In this way, a stabilization of the pressure gradients is achieved between the prevacuum sluice chamber and the process chamber such that the further intermediate vacuum chambers with their sluice valves are rendered superfluous. As a result, the activation times for the sluice valves no longer apply. However, the drawback to this solution is that this transfer chamber requires a high level of constructional technology and expense and occupies considerable space.

BRIEF SUMMARY OF INVENTION

The task of the invention involves designing the sluice system of the vacuum coating facility in such a way that the total cycle time of the sluice system is reduced while, at the same time, the constructional and system technology and expense is reduced.

The task was solved in such way that the prevacuum sluice chamber directly adjoins the transfer chamber and the fine vacuum can be regulated in the prevacuum sluice chamber. A separate fine vacuum sluice chamber is no longer necessary in the sense of the present invention. The fine vacuum in a fine vacuum pressure stage which comes very close to the process vacuum pressure is generated directly in the prevacuum sluice chamber. This is realized by a pump system extension to the usual prevacuum pump system in the combination corresponding to the invention with turbo-molecular pumps whose use for evacuation of the prevacuum sluice chamber has so far not been possible technically. Normally, a turbo-molecular pump could only be used above an absolute pressure of approx. $2 \cdot 10^{-3}$ bar, and at a higher pressure the excessively high gas components in the pumping medium led to faults owing to significant friction and heat formation. With further development of the turbo-molecular pumps, these become more pressure compatible, with the result that they can be used at an absolute pressure of $10^{-2}$ bar. This now enables a connection of the turbo-molecular pumps above a chamber pressure of the prevacuum sluice chamber of approx. $10^{-2}$ bar, which is provided by the prevacuum pump system.

The omission of the entire fine vacuum sluice chamber also does away with the need for its sluice valves, which leads to a saving of the valve opening and closing times of the fine vacuum sluice chamber and reduces the idle times of the substrate. The total cycle time of the sluice system is therefore advantageously reduced. At the same time, there is no longer a need for structural space for the fine vacuum sluice chamber on both sides of the vacuum coating chamber.

Pump System

In an advantageous embodiment of the solution, a prevacuum pump system and a fine vacuum pump system can each be connected to the prevacuum sluice chamber. The normal prevacuum pump system for generating the prevacuum and the fine vacuum pump system for generating the fine vacuum are connected in parallel to the prevacuum sluice chamber by means of adjustable regulating valves and realize a pressure cascade in a sequential operating mode until a fine vacuum pressure stage is achieved in the prevacuum sluice chamber which comes very close to the process vacuum pressure. For this, the prevacuum pump system is initially operated whereby the fine vacuum pump system is operated in parallel in a stand-by circuit until its operational use against the regulating valve closed in the prevacuum sluice chamber. During this phase, the backing pump of the fine vacuum pump system generates a support vacuum with low power in the connection network of this pump system under which the main pump can operate. The backing pump only reaches its full power on connection of the fine vacuum pump system to the prevacuum sluice chamber for creating the requisite high-vacuum pressure. The said pump systems can therefore be reused for the prevacuum sluice chamber and the fine vacuum chamber with little control technology expense.

An advantageous embodiment of the invention results from the fact that the prevacuum pump system can be connected to the fine vacuum pump system. A connection on the medium side beside the direct connection line of the two pump systems operated in parallel makes it possible to use components of the prevacuum pump system for operation of the fine vacuum pump system and vice versa. This can be useful, for instance, if a pump of a pump system develops a fault. Pumps of the parallel pump system can be connected immediately as replacements.

In a particularly advantageous further development of the invention, the pressure side of a main pump of the fine vacuum pump system is connected to the intake side of a support pump and the pressure side of the main pump of the fine vacuum pump system can be connected to the intake side of a main pump of the prevacuum system via a connecting line with regulating valve. At the same time, the prevacuum pump system is used as a backing pump of the fine vacuum pump system. The direct connection line of the prevacuum pump system to the prevacuum sluice chamber is closed by valve closure on corresponding attainment of the pressure stage and, at the same time, the regulating valve of the connection line acting as a bypass is opened, with the result that the prevacuum pump system is connected in series to the main pump of the fine vacuum system with operational readiness. At the same time that the bypass valve is opened, the valve of the connection line of the fine vacuum pump system is opened to the prevacuum sluice chamber, and as a result the prevacuum pump system can serve as a backing pump of the fine vacuum pump system. The actual backing pump arrangement of the fine vacuum pump system is no longer necessary in the normal embodiment and capacity. Only a support pump with minimum power needs to be present on the pressure side, which realizes a vacuum support pressure for the main pump of the fine vacuum pump system in its startup and stand-by phase with closed regulating valves, so that the main pump of the fine vacuum pump system is always ready for use at all times.

BRIEF DESCRIPTION OF DRAWING FIGURES

Figure 2:
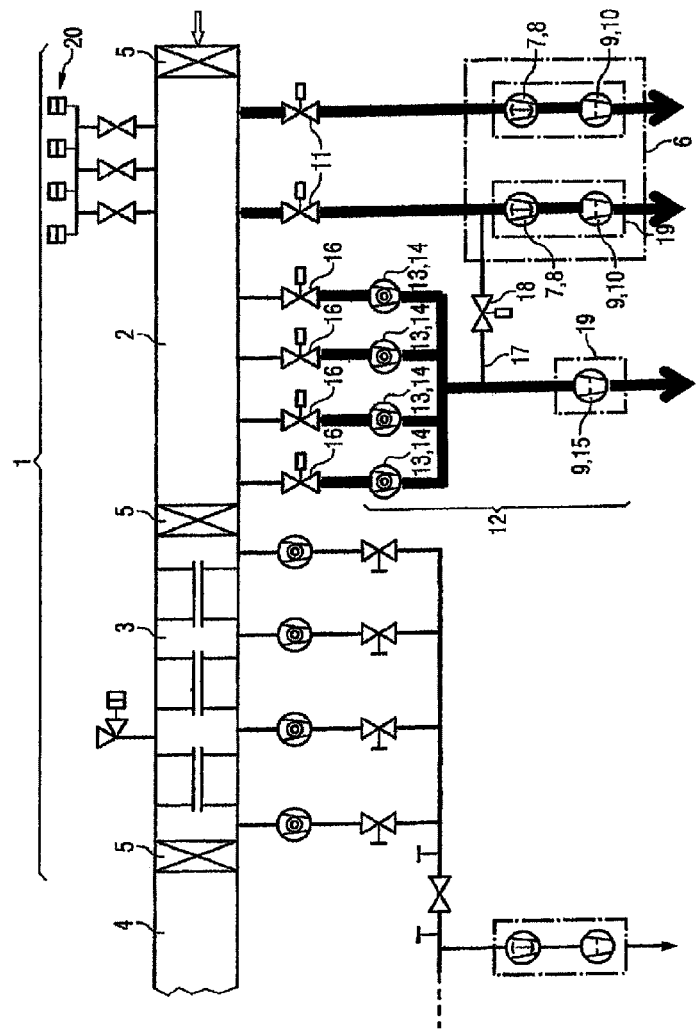
Figure 3:
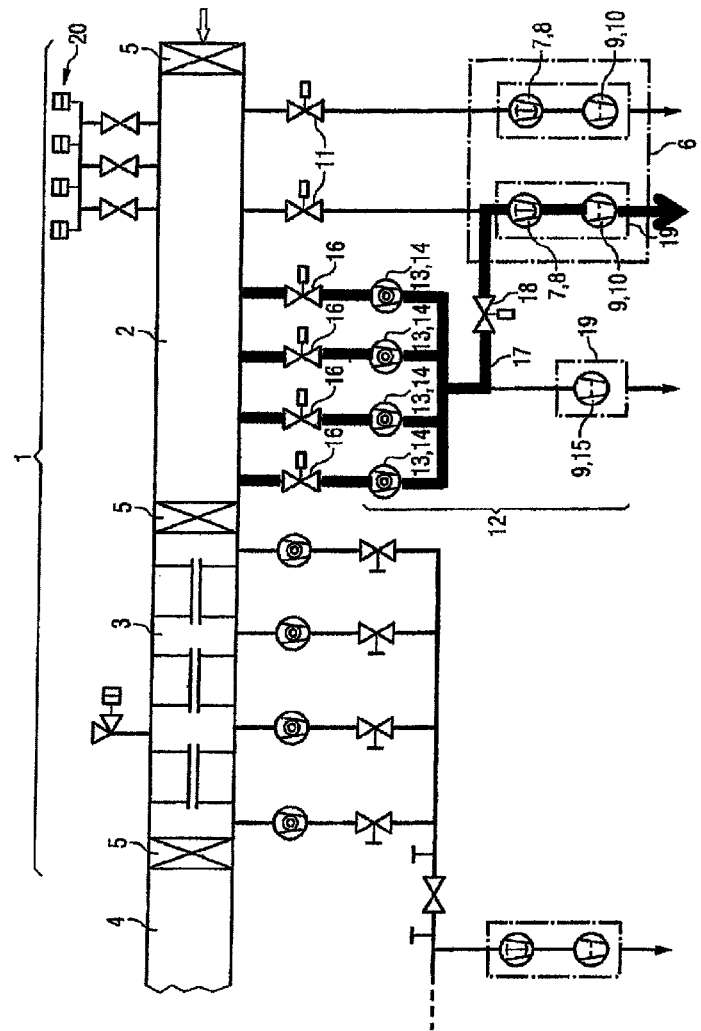

FIG. 1 depicts a sluice system for a vacuum facility according to the present invention;
FIG. 2 depicts the sluice system in a first operating state; and
FIG. 3 depicts the sluice system in a second operating state.

DETAILED DESCRIPTION

The invention will be explained by means of an embodiment example. The sluice system 1 on the input side for in-line coating facilities is shown in the accompanying drawing. Only the components relevant for the invention are shown. In the sluice system 1 according to the invention, the transfer chamber 3 is connected to the prevacuum sluice chamber 2, which in turn directly adjoins the coating chamber 4. The individual chambers are separated from each other via vacuum system sluice valves 5. The prevacuum is generated in the prevacuum sluice chamber 2 by prevacuum pump systems 6 connected in parallel to the prevacuum sluice chamber. These pump systems respectively consist of a Roots pump 7 as a main pump 8 and a rotary slide-valve pump 9 connected in series as a backing pump. Both connections of the prevacuum pump system 6 can be separated from the prevacuum sluice chamber 2 via regulating valves 11. A fine vacuum pump system 12 with four turbo-molecular pumps 13 as main pumps 14 is connected in parallel arrangement to the prevacuum sluice chamber 2. A rotary slide-valve pump 9 of lesser power is connected in series to these main pumps 14 as a support pump 19. The connections of the fine vacuum pump system 12 can also be separated from the prevacuum sluice chamber 2 via regulating valves 16. A connection line 17 between the pressure side of the main pumps 14 of the fine vacuum system 12 and the intake side of the main pump 8 of one of the two prevacuum systems 6, separable via a further regulating valve, realizes a bypass connection between the two vacuum systems. After one or more substrates have been fed into the prevacuum sluice chamber, the prevacuum is regulated via the operation of the prevacuum pump systems 6. During this first operating state, as shown in FIG. 2, the regulating valves 16 of the fine vacuum system 12 and the regulating valve 18 of the connection line 17 are closed. At the same time, the turbomolecular pumps 13 are already operated in a stand-by stage. The turbo-molecular pumps 13 require a long startup time of up to 15 minutes corresponding to their design. However, they can be kept in immediate operational readiness after their startup time by means of a vacuum pressure support. The turbomolecular pumps 13 are therefore run in permanent operation, whereby the support pum 15 connected upstream of the turbomolecular pumps 13 generates a vacuum support pressure of approx. $10^{-5}$ bar for the turbo-molecular pumps 13 in standby mode with closed regulating valves 11, 16. As the intake volume to be pumped approaches zero for this, only a low power is necessary for the support pump 15 to attain the vacuum support pressure. If a volume of approx. $10^{-2}$ bar is attained in the prevacuum sluice chamber, the regulating valve 18 of the connecting line 17 is opened. In this second operating state, as shown in FIG. 3, the turbo-molecular pumps 13 now evacuate in their work mode stage from the prevacuum sluice chamber 2, whereby the prevacuum pump system 6 connected via the connection line 17 is now operated in its function as a prevacuum pump of the fine vacuum pump system 12 and a separate efficient backing pump is saved for the turbomolecular pumps 13. The fine vacuum close to the process vacuum pressure of approximately $10^{-4}$ bar to $10^{-5}$ bar is generated directly after the prevacuum sluice chamber generation in the prevacuum sluice chamber 2, without the substrate having to pass further sluice chambers. The entire sluice contact until attainment of the fine vacuum is therefore reduced to approximately 60 seconds.

The invention claimed is:

1. Sluice system of a vacuum coating facility for coating substrates moved through the vacuum coating facility in at least one direction of conveyance, comprising:

a vacuum coating chamber, a transfer chamber separated from the vacuum coating chamber by a first sluice valve and maintained at a coating process vacuum pressure, a prevacuum sluice chamber directly adjoining the transfer chamber and separated from the transfer chamber by a second sluice valve, a prevacuum pump system connected by a first selectively activatable valve arrangement to the prevacuum sluice chamber, and a high-vacuum pump system connected to the prevacuum sluice chamber by a second selectively activatable valve arrangement, the second valve arrangement being activated and deactivated inversely to the first valve arrangement to realize a pressure cascade in a sequential operating mode until a high vacuum pressure stage is achieved in the prevacuum sluice chamber close to the coating process vacuum pressure, wherein the prevacuum pump system is selectively connected to the prevacuum sluice chamber in a first operating state and, alternatively, is activated in a second operating state as a backing pump arrangement of the high-vacuum pump system, and wherein the high-vacuum pump system includes a support pump activated in the first operating mode as a backup pump arrangement of the high-vacuum pump system to maintain the high-vacuum pump system in a standby ready-to-operate mode, and wherein a pressure side of a main pump of the high-vacuum pump system is connected to an intake side of the support pump and detachably connected to an intake side of a main pump of the prevacuum pump system in parallel to the support pump by a bypass line and a bypass valve, and wherein the bypass valve is activated inversely to the first valve arrangement.

2. Sluice system according to claim 1, wherein the prevacuum pump system comprises at least one Root pump as the main pump and at least one rotary slide-valve pump as a backing pump.

3. Sluice system according to claim 1, wherein the high-vacuum system comprises at least one turbo-molecular pump as the main pump, and at least one backing pump arrangement which corresponds to a backing pump arrangement of the prevacuum pump system.

* * * * *